(12) United States Patent
Lanz et al.

(10) Patent No.: US 10,610,951 B2
(45) Date of Patent: Apr. 7, 2020

(54) DEVICE HAVING MONITORED DEVICE COOLING

(71) Applicant: Fronius International GmbH, Pettenbach (AT)

(72) Inventors: Bernhard Lanz, Unterach (AT); Alexander Eder, St. Thomas (AT); Andreas Lugmayr, Pfarrkirchen bei Bad Hall (AT)

(73) Assignee: Fronius International GmbH, Pettenbach (AT)

( * ) Notice: Subject to any disclaimer, the term of this patent is extended or adjusted under 35 U.S.C. 154(b) by 189 days.

(21) Appl. No.: 15/580,673

(22) PCT Filed: Jun. 13, 2016

(86) PCT No.: PCT/EP2016/063463
§ 371 (c)(1),
(2) Date: Dec. 7, 2017

(87) PCT Pub. No.: WO2016/202726
PCT Pub. Date: Dec. 22, 2016

(65) Prior Publication Data
US 2018/0185951 A1    Jul. 5, 2018

(30) Foreign Application Priority Data
Jun. 15, 2015   (EP) .................................... 15172103

(51) Int. Cl.
B23K 9/32        (2006.01)
B23K 37/00       (2006.01)
(Continued)

(52) U.S. Cl.
CPC ............ B23K 9/321 (2013.01); B23K 9/0953 (2013.01); B23K 9/1006 (2013.01);
(Continued)

(58) Field of Classification Search
CPC .. B23K 11/241; B23K 37/003; B23K 37/006; B23K 9/0953; B23K 9/1006;
(Continued)

(56) References Cited

U.S. PATENT DOCUMENTS

2002/0161558 A1   10/2002   Georges et al.
2005/0099741 A1   5/2005    Stenestam et al.
(Continued)

FOREIGN PATENT DOCUMENTS

DE        196 26 059 A1      1/1998
DE     10 2005 058351 A1     6/2007
(Continued)

OTHER PUBLICATIONS

Notification of Transmittal of the International Search Report and the Written Opinion of the International Searching Authority, or the Declaration for International Application No. PCT/EP2016/063463 (dated Sep. 6, 2016).
Examination Report under sections 12 & 13 of the Patents Act, 1970 and the Patents Rules, 2003 for Indian Patent Application No. 201827001542 (dated Sep. 26, 2019).
(Continued)

*Primary Examiner* — Yuhui R Pan
(74) *Attorney, Agent, or Firm* — Jenkins, Wilson, Taylor & Hunt P.A.

(57) ABSTRACT

Device (1) for the provision of electric power, wherein the device (1) comprises: at least one integrated temperature sensor (3-1, 3-2) which detects an operating temperature progression of at least one component (2-1, 2-2) of the device (1) and a monitoring unit (5) which, on the basis of the at least one detected operating temperature progression and the adjusted power, monitors the operating state of a device cooling arrangement of the device (1).

10 Claims, 6 Drawing Sheets

(51) Int. Cl.
  *B23K 11/24* (2006.01)
  *G05B 23/02* (2006.01)
  *B23K 9/10* (2006.01)
  *B23K 9/095* (2006.01)
  *G05B 19/406* (2006.01)
  *H05K 7/20* (2006.01)

(52) U.S. Cl.
  CPC .......... *B23K 9/1062* (2013.01); *B23K 11/241* (2013.01); *B23K 37/003* (2013.01); *B23K 37/006* (2013.01); *G05B 19/406* (2013.01); *G05B 23/0232* (2013.01); *G05B 23/0245* (2013.01); *G05B 23/0275* (2013.01); *H05K 7/20209* (2013.01)

(58) Field of Classification Search
  CPC .... B23K 9/1062; B23K 9/321; G05B 19/406; G05B 23/0232; G05B 23/0245; G05B 23/0275; H05K 7/20209
  See application file for complete search history.

(56) References Cited

U.S. PATENT DOCUMENTS

| | | |
|---|---|---|
| 2008/0294297 A1 | 11/2008 | Bretzner et al. |
| 2009/0299531 A1 | 12/2009 | Kitamura et al. |
| 2012/0078438 A1 | 3/2012 | Navas |
| 2013/0346926 A1 | 12/2013 | Pandurangan et al. |
| 2016/0183406 A1* | 6/2016 | Ragupathi .......... H05K 7/20209 700/282 |

FOREIGN PATENT DOCUMENTS

| | | | | |
|---|---|---|---|---|
| DE | 102005058351 A | * | 6/2007 | .......... B23K 11/252 |
| DE | 10 2012 013104 A1 | | 1/2013 | |

OTHER PUBLICATIONS

The First Office Action for Chinese Patent Application No. 201680035279.4 (dated Sep. 25, 2019).

* cited by examiner

DEVICE HAVING MONITORED DEVICE COOLING

The invention relates to a device with monitored device cooling and a method for monitoring an operating state of a device cooling arrangement in a device, in particular in an energy device, which provides or converts an electric current. Energy devices such as these comprise battery charging devices, inverters and welding devices.

Welding devices have a welding current source which supplies an electric current to carry out the welding process. A welding inverter constitutes an electronic welding current source. Inverter welding devices are used for different arc welding processes such as e.g. electrode, MIG/MAG, plasma and WIG/TIG welding. Depending on the power involved, such devices are connected to a power network in a monophase or triphase manner. In the case of a welding inverter, the network voltage is first rectified and chopped with the aid of power semiconductors and is transformed to a low voltage by means of a relatively small transformer. The welding current is then rectified by means of suitable diodes.

Energy devices, in particular welding current sources, can comprise a multiplicity of different electronic and/or electromechanical components. The power and switch-on duration of the welding current source is limited by the permissible component temperatures in the device. If a limit temperature is reached, the device switches off until the component concerned cools down. Conventional welding devices can have monitoring electronics. DE 196 260 59 A1 describes a welding device having monitoring electronics which emits a signal to a switching element if a set value is exceeded in order to trigger a switching process. In this way, if a fault occurs within the welding device the operator can be protected from danger. For example, if a limit temperature is reached, the welding device is switched off.

In welding devices it can occur that, by reason of an impairment in the welding device cooling arrangement, the temperature within the housing of the welding device is increased without the limit temperatures being reached. If the cooling of the welding device is impaired, the average temperature within the housing increases so that the service life of individual components or parts, and therefore the service life of the device, is reduced. If the device cooling arrangement is impaired, the limit temperature is reached sooner, whereby the switch-on duration set by the manufacturer can no longer be maintained since the device switches off after a short welding time. The welding current source is frequently physically distant or separate from the welding process. Thus, during welding, whether manual or automated with a robot, an impairment in the welding device cooling arrangement, e.g. by excessively high ambient temperature, is not evident.

By carrying out regular maintenance work, e.g. cleaning of a cooling air path, this can be counteracted but the work and time involved in this is considerable, in particular in also discovering the definitive cause of the impairment in the cooling arrangement.

It is thus an object of the present invention to create an apparatus and a method which make it possible to reduce the maintenance effort with respect to the device cooling arrangement in an energy device.

In accordance with the invention, this object is achieved by a device having the features stated in claim 1.

The invention accordingly creates a device for the provision of electric power, wherein the device comprises:
at least one integrated temperature sensor which detects an operating temperature progression of at least one component of the device and
a monitored unit which, on the basis of the at least one detected operating temperature progression and the power, monitors the operating state of a device cooling arrangement of the device.

In a possible embodiment of the device in accordance with the invention the device has at least one further temperature sensor which detects an ambient temperature in the vicinity of the device and signals it to the monitoring unit of the device.

In a further possible embodiment of the device in accordance with the invention the monitoring unit is designed to analyse, in the case of a deviation of the monitored operating state of the device cooling arrangement from a normal operating state of the device cooling arrangement, the detected operating temperature progressions of different components in order to determine at least one potential cause of the deviation in the operating state.

In a further possible embodiment of the device in accordance with the invention the device comprises a user interface which comprises a display unit for displaying the deviation in the operating state of the device cooling arrangement, the determined cause of the deviation in the operating state and instructions for eliminating the determined cause of the deviation in the operating state of the device cooling arrangement.

In a further possible embodiment of the device in accordance with the invention the user interface further comprises an input unit for adjustment of the current by a user and/or by a central control device of an installation.

In a further possible embodiment of the device in accordance with the invention the components comprise electronic and/or electromechanical components which have the associated cooling units to cool the respective component.

In a further possible embodiment of the device in accordance with the invention the device cooling arrangement comprises, as a component, at least one ventilation unit which supplies cooling air from the vicinity of the device to further components along a cooling air path within a housing of the device.

In a further possible embodiment of the device in accordance with the invention, the components along the cooling air path comprise associated temperature sensors which detect an operating temperature progression at the respective components and signal it to the monitoring unit of the device.

In a further possible embodiment of the device in accordance with the invention this device comprises a current measuring unit which measures the adjusted current and signals it to the monitoring unit.

In a further possible embodiment of the device in accordance with the invention the monitoring unit controls at least one actuator, in particular a cooling unit and/or a ventilation unit, in dependence upon the momentary operating state of the device cooling arrangement.

In a further possible embodiment of the device in accordance with the invention the monitoring unit has access to a data memory which stores a data model of the device, in particular a data model of the components contained therein and the physical position thereof along the cooling air path.

In a further possible embodiment of the device in accordance with the invention the monitoring unit signals the operating state of the device cooling arrangement to a central control device of an installation via a network interface of the device.

The invention further creates a method for monitoring an operating state of a device cooling arrangement in a device having the features stated in claim 14.

The invention accordingly creates a method for monitoring an operating state of a device cooling arrangement in a device, comprising the steps of:

detecting an operating temperature progression of at least one component of the device and determining the operating state of the device cooling arrangement on the basis of the at least one detected operating temperature progression and electric power provided by the device.

In a further possible embodiment of the method in accordance with the invention, in the case of a deviation of the determined operating state of the device cooling arrangement from a normal operating state of the device cooling arrangement, the detected operating temperature progressions of the components are analysed in order to identify at least one potential cause of the deviation in the operating state of the device cooling arrangement.

In a further possible embodiment of the method in accordance with the invention a deviation in the operating state of the device cooling arrangement and at least one identified potential cause of the deviation in the operating state and instructions for eliminating the corresponding cause are output via a user interface and/or a network interface of the device.

Possible embodiments of the device in accordance with the invention and of the method in accordance with the invention for monitoring an operating state of a device cooling arrangement in the case of a device are explained in more detail hereinafter with reference to the attached figures, in which.

Figure 1:
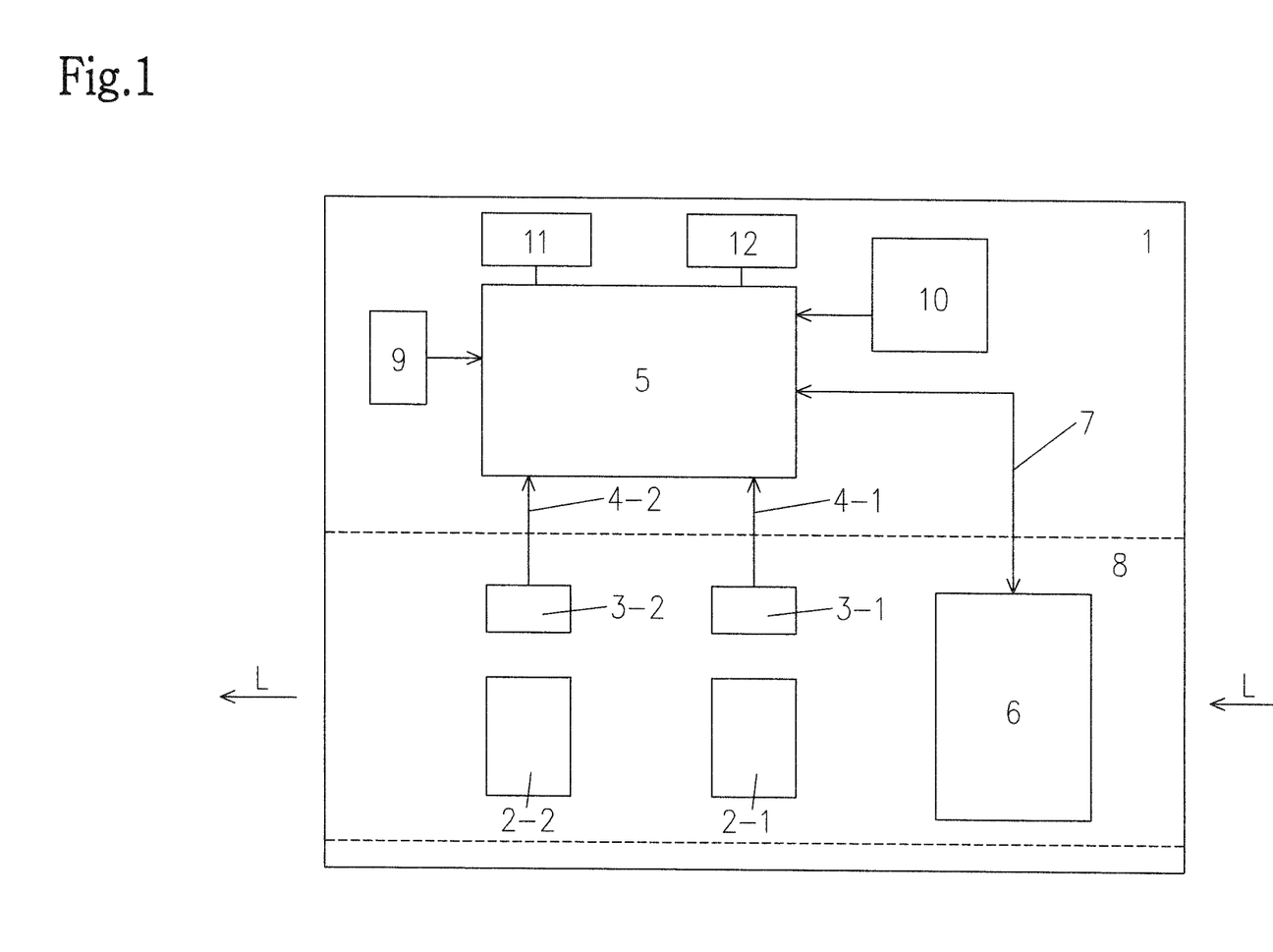
FIG. 1 is a block circuit diagram to schematically illustrate an exemplified embodiment of a device in accordance with the invention.

FIG. 1 shows a schematic block circuit diagram to illustrate an exemplified embodiment of a device 1 in accordance with the invention. The device 1 in a possible embodiment is a welding device which supplies a welding torch with an adjustable electric current. The welding device 1 can contain a multiplicity of different parts or components which are used on the one hand as control electronics and on the other hand for power electronic purposes. These components or parts include e.g. electronic or electromechanical components. FIG. 1 schematically illustrates two components 2-1, 2-2 which are e.g. electronic components or electronic assemblies. The two components or assemblies 2-1, 2-2 have an operating temperature T which in the illustrated embodiment is detected via an associated temperature sensor 3-1, 3-2.

The temperature sensors each detect an operating temperature progression T(t) of the associated component or of the associated assembly, in particular a power element, within the welding device 1. The temperature sensors 3-1, 3-2 can be attached directly to the associated component 2-1, 2-2 or are located in the immediate physical proximity of the component 2-$i$ concerned. In a further possible embodiment, the components or assemblies 2-$i$ each have at least one integrated temperature sensor 3-$i$ which detects the operating temperature progression T(t) of the component 2-$i$ concerned by means of sensors. The integrated temperature sensors 3-$i$ are connected to a monitoring unit 5 via signal lines 4-1, 4-2. The temperature sensors 3-1, 3-2 transmit the operating temperature progression T(t) of the associated component 2-$i$ to the monitoring unit 5. The monitoring unit 5 monitors, on the basis of the detected operating temperature progressions and an adjusted welding current I of the welding device 1, the operating state of a welding device cooling arrangement of the welding device 1.

In the exemplified embodiment illustrated in FIG. 1, the welding device 1 contains a ventilation unit 6 which is connected to the monitoring unit 5 via lines 7. The ventilation unit 6 or the ventilator draws cooling ambient air from the vicinity of the welding device 1, wherein the cooling air L sweeps along a cooling air path 8 within the welding device 1 past the components 2-1, 2-2 and/or past the cooling ribs of a cooling body provided for component cooling in order to cool same and exits the housing of the welding device 1 at another location as schematically illustrated in FIG. 1. The ventilation unit 6 can e.g. also be part of a liquid cooling arrangement in that the liquid is cooled using ambient air—e.g. via a heat exchanger.

In the illustrated example, the welding device cooling arrangement comprises the ventilation unit 6 for cooling the components 2-1, 2-2. In a possible embodiment the electronic and/or electromechanical components 2-$i$ additionally each comprise associated cooling units for cooling the respective component 2-$i$. These cooling units are e.g. cooling bodies which are attached or screwed to the respective component 2-$i$. The components 2-$i$ along the cooling air path 8 preferably each comprise an associated temperature sensor 3-$i$ which signals an operating temperature progression T(t) at the respective component 2-$i$ to the monitoring unit 5 of the welding device 1. The transmission of the operating temperature data is carried out via the signal lines 4-$i$. The temperature sensors 3-$i$ preferably continuously detect the operating temperature of the respective associated component 2-$i$. On the basis of the welding current or welding power provided by the welding device 1 the monitoring unit 5 can derive or determine the operating state of the welding device cooling arrangement which is to be expected, so that these [sic] can serve as reference values. The operating temperature progressions T(t), currently signalled by the temperature sensors 3-$i$, at the components 2-$i$ within the cooling path 8 can be compared by the monitoring unit 5 with the expected operating temperature progressions. In the case of a deviation resulting after the comparison of the monitored operating state of the welding device cooling arrangement with the normal expected operating state of the welding device cooling arrangement, the monitoring unit 5 carries out an analysis of the detected operating temperature progressions of different components 2-$i$ to determine at least one potential cause of the deviation in the operating state which has occurred.

In a possible embodiment the welding device 1 additionally has at least one further temperature sensor 9 which signals an ambient temperature prevailing in the vicinity of the welding device 1 to the monitoring unit 5 of the welding device 1. The ambient temperature sensor 9 can be disposed externally on the housing and/or directly on the inside of the housing. Therefore, factors such as direct incident solar radiation or weather influences generally on the welding device 1 can be taken into consideration. This can also take place in dependence on the time of day.

This ambient temperature is preferably also considered by the monitoring unit 5 in order to carry out the analysis. The welding device or the current source 1 delivers welding current I to an external welding unit, in particular a welding torch. In a possible embodiment, the current I supplied by the welding device 1 is measured by a current measuring unit 10 integrated in the welding device 1 and signalled as a parameter to the monitoring unit 5. With the aid of this additional parameter, the monitoring unit 5 can determine the operating state normally to be expected. As parameters it is also possible to use, alternatively or additionally, voltage progressions, regulator states, constant current/constant voltage curves and/or other dynamic processes, the selected welding curve etc.

In the exemplified embodiment illustrated in FIG. 1, the welding device 1 has a user interface 11 for a user of the welding device 1, e.g. a welder. The user interface 11 preferably has a display unit which serves to display a deviation in the operating state of the welding device cooling arrangement, a determined cause of the deviation in the operating state and to output instructions for elimination of the determined cause of the deviation in the operating state by reason of the analysis carried out. The user interface 11 can also comprise an input unit for adjustment of the welding current I by the user. In a possible embodiment, the welding device 1 also has a network interface 12 which connects the welding device 1 via a network, in particular a data network, to a central control device of an installation. In a possible embodiment, this central control device can monitor and control different devices, in particular welding devices 1. In a possible embodiment, the monitoring unit 5 signals, via the network interface 12 of the welding device 1, the operating state of the welding device cooling arrangement of the welding device 1 to the central control device of the installation.

In a possible embodiment, the monitoring unit 5 controls at least one actuator of the welding device 1 in dependence upon the momentary operating state of the welding device cooling arrangement. In a possible embodiment, the monitoring unit 5, in dependence upon the momentary operating state of the welding device cooling arrangement, controls the cooling unit within the welding device 1 or a ventilation unit, e.g. the ventilator 6, corresponding to the momentary operating state of the welding device cooling arrangement. In a possible embodiment, the monitoring unit 5 additionally has access to a data memory which stores a data model of the welding device 1. This stored data model preferably includes the components or assemblies 2-*i* contained in the welding device 1 and the absolute or relative physical position thereof relative to one another along the cooling air path 8. The data model also includes e.g. reference values relating to how the cooling air path 8 behaves in the case of different ambient temperatures.

In a possible embodiment, the monitoring unit 5 can contain one or a plurality of microprocessors which carry out a monitoring program. The monitoring unit 5—which can also be integrated in the control device of the current source—carries out an intelligent evaluation of the temperature progressions, supplied by the temperature sensors 3-*i*, within the welding device 1 and effects an analysis as to why the cooling performance within the cooling air path 8 has decreased. The analysis of the welding device cooling arrangement is carried out by the monitoring unit 5 in order to discover potential causes for this deviation in the operating state. The monitoring unit 5 signals via the display unit of the user interface 11 the deviation in the operating state of the welding device cooling arrangement which has occurred and at the same time provides directions for eliminating the determined potential cause of this change in the operating state. By this type of state monitoring or condition monitoring it is possible to extend the intervals between maintenance operations of the welding device 1. Upon occurrence of a change in operating state, the user additionally obtains a precise description of the fault and instructions for elimination of the determined potential cause of the fault. In this way the maintenance of the welding device 1 with respect to its cooling arrangement is considerably simplified and the time required for maintenance is shortened. With the device 1 in accordance with the invention and the method in accordance with the invention the operating state of the device cooling arrangement is monitored so that faults which arise can be identified early i.e. not just when limit temperatures are exceeded. The early elimination of the defective cooling arrangement resulting therefrom means that the components 2-*i* contained in the device 1 are on average exposed to a lower average temperature and therefore have a clearly longer expected operating life. In this way, the service life or operating time of the device 1 as a whole is clearly increased.

The impairment in the cooling performance is thus displayed to the user early (e.g. in colour), whereby this user can deduce the maximum possible switch-on duration. This is crucial to a welding process as to whether welding can be carried out without interruption. Accordingly the adjusted power must be available throughout the duration of welding. Therefore, an unexpected break-off in welding processes can be prevented and rejects can thereby be avoided.

The manner of operation of the device 1 in accordance with the invention and of the method in accordance with the invention for monitoring an operating state of a device cooling arrangement is explained by way of example hereinunder with reference to the temperature progressions illustrated in FIGS. 3 to 6. The diagrams show the temperature T of components, e.g. of the components 2-1, 2-2 illustrated in FIG. 1, over time t. The temperature progressions illustrated therein can be indicated by temperature sensors e.g. the temperature sensors 3-1, 3-2 illustrated in FIG. 1.

Figure 3:
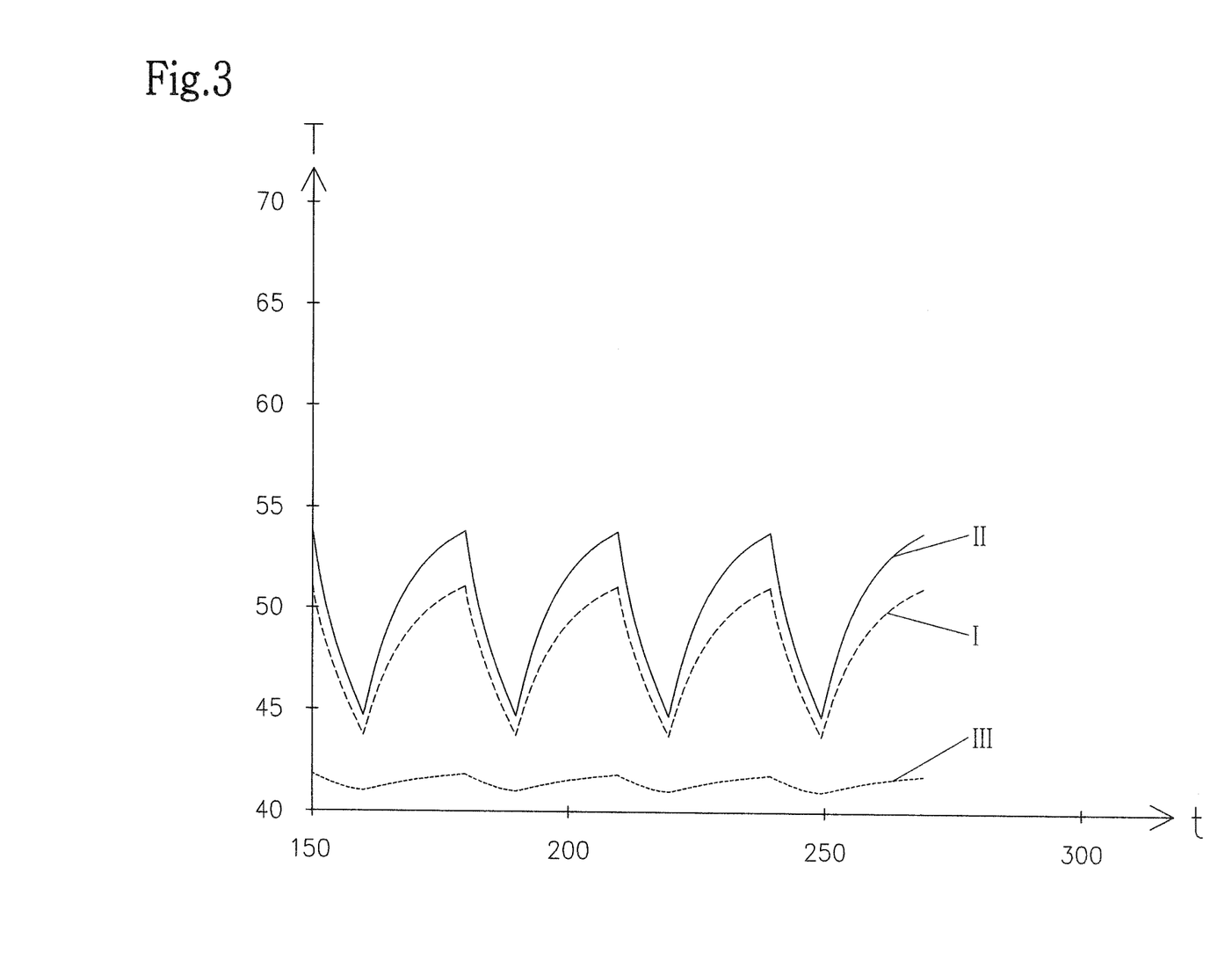
FIGS. 3, 4, 5 and 6 show temperature progressions to explain the manner of operation of the device in accordance with the invention and of the method in accordance with the invention for monitoring an operating state of a device cooling arrangement in the case of a device.

FIG. 3 shows an example of a temperature progression T(t) in a welding device 1 with a functioning cooling arrangement at an ambient temperature of 40° C. In normal operation of the welding device 1, this welding device is at a relatively constant temperature of about 42° C., slightly increased with respect to the ambient temperature, as illustrated in FIG. 3 by curve III. Curves I, II show the temperature progression of two components within the welding device 1, e.g. of components 2-1, 2-2 in FIG. 1. As shown in FIG. 3, the temperature progression is periodical in the case of both components 2-*i*, wherein the operating temperature increases during a welding period and falls during a subsequent pause in welding.

Figure 4:
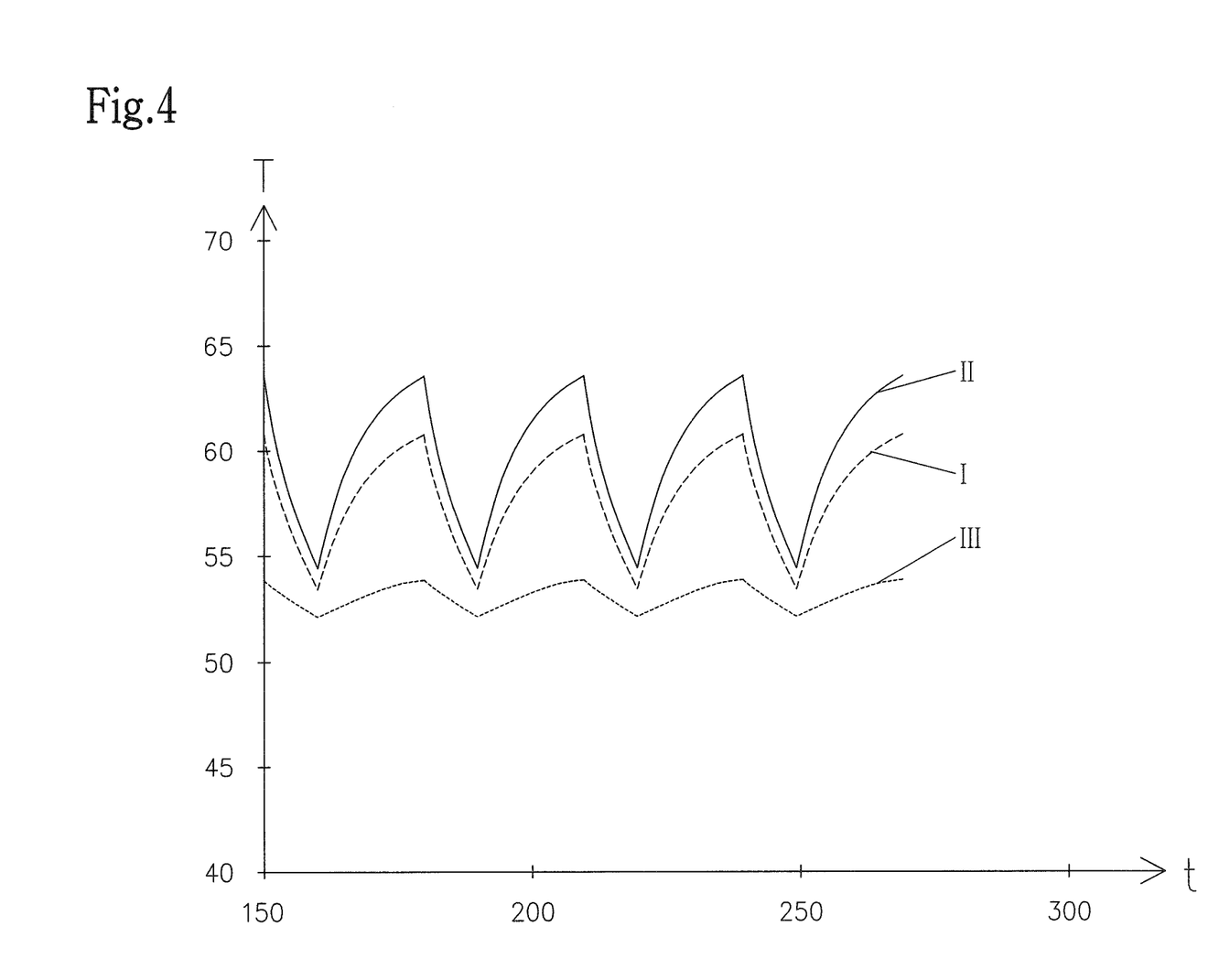

FIG. 4 shows the temperature progression T(t) in the case of an increased ambient temperature of 50° C. with the cooling arrangement of the welding device 1 functioning. The ambient temperature is signalled to the monitoring unit 5 e.g. by the ambient temperature sensor 9. However, the progression of the curves I to III as in FIG. 3 are correspondingly shifted upwards by the value of the higher ambient temperature. For example, the temperature in normal operation is thus ca. 55° C.

Figure 5:
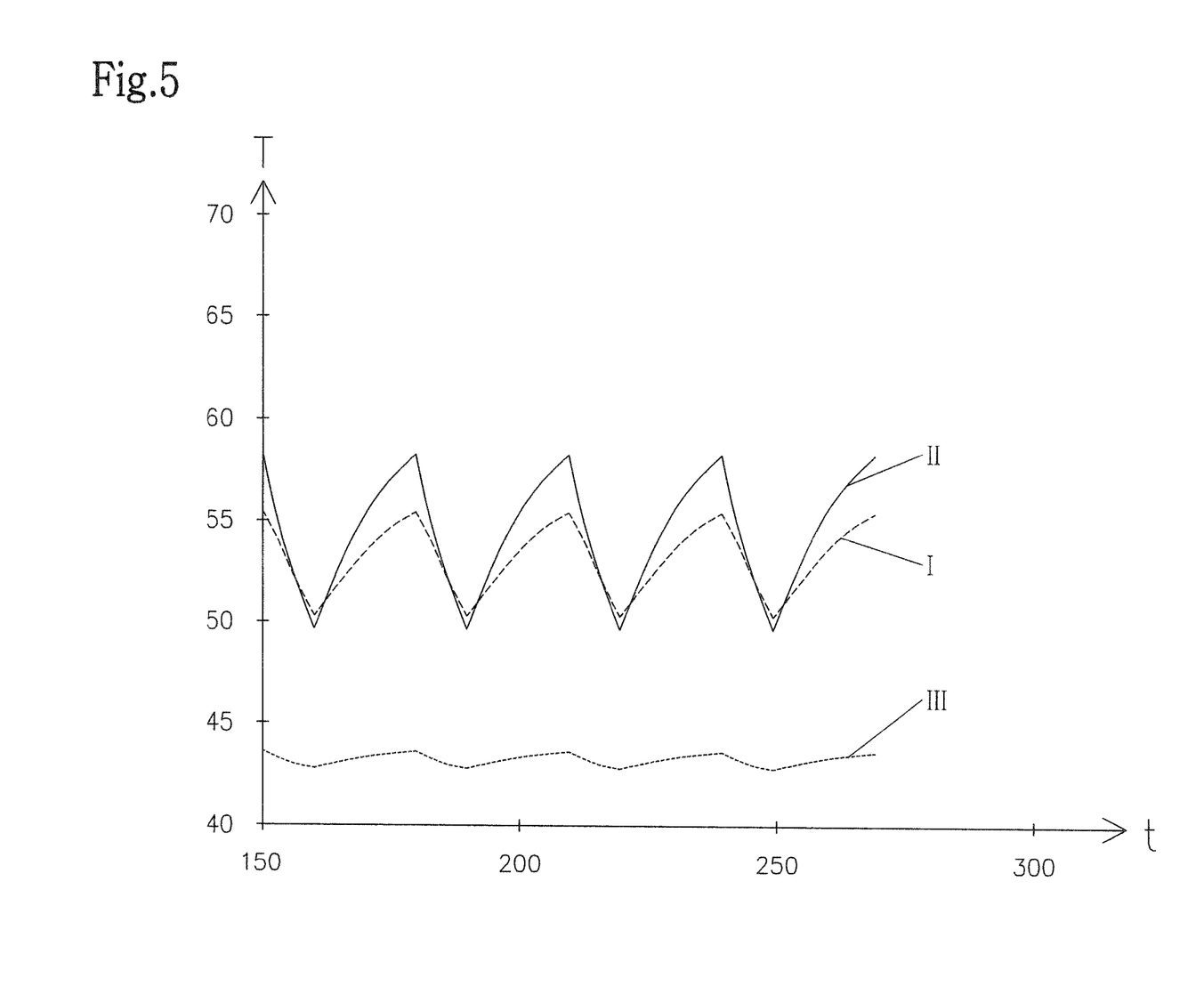

FIG. 5 shows the temperature progressions T(t) at the two components 2-1, 2-2 at an ambient temperature of 40° C. with the cooling air supply blocked. As shown by FIG. 5, the temperature T within the welding device 1 outside the cooling air path 8 within the housing of the welding device 1 is slightly higher than the temperature progression in FIG. 3 (curve III), while the temperature progressions signalled by the temperature sensors 3-1, 3-2 of the two components 2-1, 2-2 are both clearly increased. This is a clear indication that the cooling air supply within the cooling path 8 within the welding device 1 is blocked by reason of a defective fan 6. By reason of the defective fan 6 the temperature progressions T(t) of the two components 2-1, 2-2 (curve I, curve II) contained in the cooling air path 8 are shifted upwards in parallel.

Figure 6:
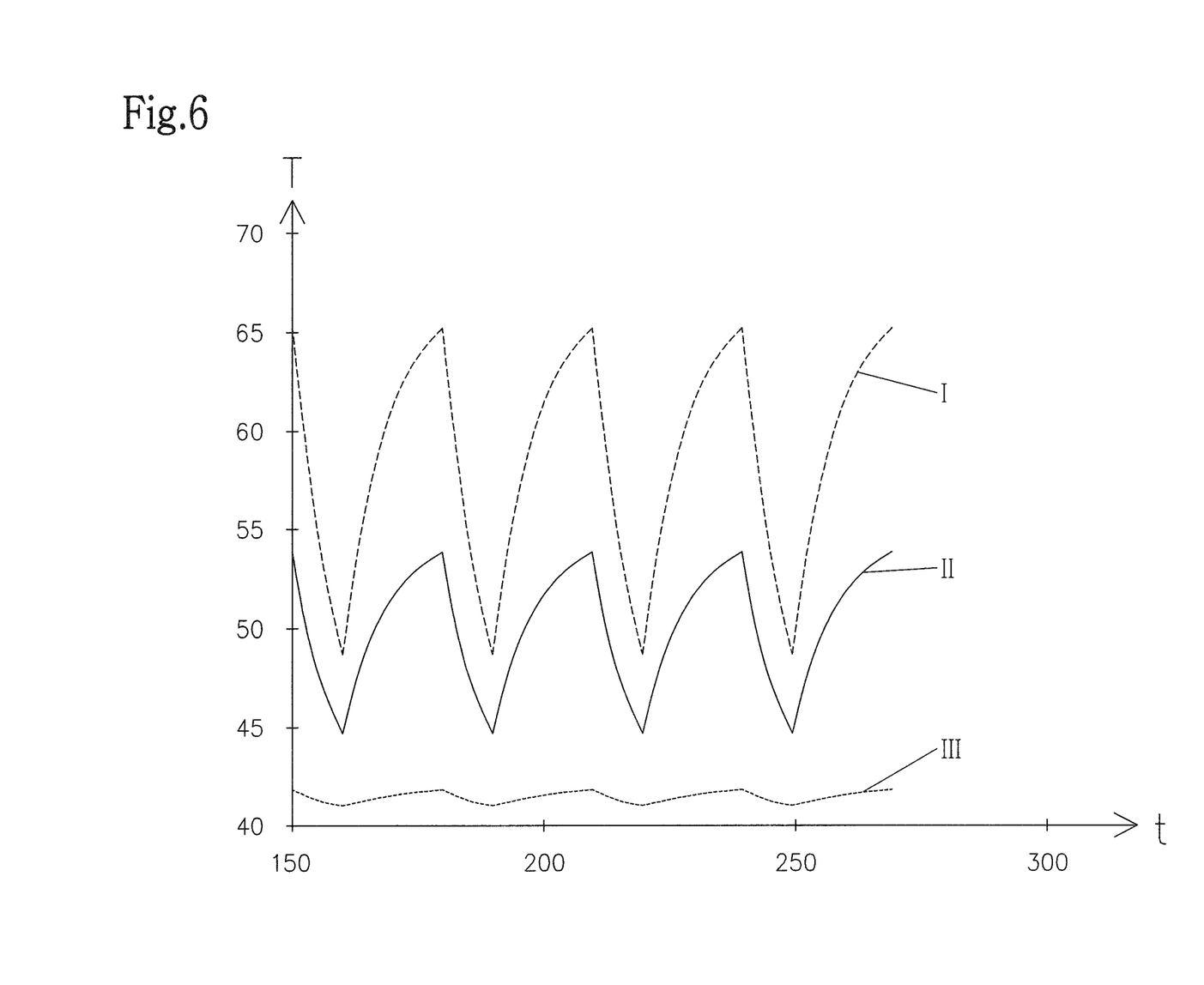

FIG. 6 shows the temperature progressions T(t) in the case of an ambient temperature of 40° C. when a different fault occurs. As shown in FIG. 6 (curve I) the temperature progression which is transmitted by the sensor 3-1 of the first component 2-1 to the monitoring unit 5 is clearly increased compared to the temperature progression shown in FIG. 3. In addition, the temperature fluctuations on the first component 2-1 are clearly greater compared with the temperature fluctuations on the other component 2-2 (curve II). From the temperature progression illustrated in FIG. 6 the monitoring unit 5 can deduce a fault in the cooling unit of the first component 2-1 (curve I). If this component 2-1 has e.g. a cooling body which is screwed onto the component 2-1 it is possible to conclude from the temperature progression illustrated in FIG. 6 that the screw connection between the cooling body and the associated component 2-1 is presumably loose. In this case, a user can receive the instruction e.g. with respect to maintenance to check the cooling unit of the component 2-1 and possibly to screw the cooling body more tightly to the component 2-1 affected.

The monitoring unit 5 can carry out the analysis of the different temperature progressions T(t) under consideration of the ambient temperature $T_U$ and the momentarily output welding power, in order to identify possible deviations from a normal operating state of the cooling arrangement. As soon as the deviation in the operating state of the cooling arrangement of the welding device 1 is identified, it is possible, by analysis of the temperature progressions T(t), the ambient temperature $T_U(t)$, the rotational speed of the ventilator 6 and/or of the output welding current I, according to welding power to carry out an analysis as to which possible causes of faults are responsible for the temperature progression which have occurred. In recording the temperature progressions, the cooling times can also be detected. From the cooling time it is possible to determine or derive the operating state of the cooling arrangement. For this purpose, e.g. reference values can be stored.

In a possible embodiment, the monitoring unit 5 can sort different possible causes of faults corresponding to their probability and to display them to the user via the user interface 11. In a possible special embodiment, the monitoring unit 5 has access to an internal or external data memory which contains a data model of the welding device 1. This data model preferably indicates the components contained in the welding device 1 and preferably the physical location thereof along the cooling air path 8. By consideration of this data model the monitoring unit 5 can refine the analysis of the temperature progressions T(t) signalled to it, since the data model shows the relative position of the different components 2-i with respect to each other within the cooling air path 8. In a possible embodiment, the deviations in the operating state of the cooling arrangement which have occurred and the analysis results can be signalled by the monitoring unit 5 via the network interface 12 to a central control device of an installation in order to bring about the necessary maintenance measures. The monitoring unit 5 can identify the widest range of causes of faults or deviations in the operating state, e.g. that the supply of cooling air in the cooling air path 8 is blocked or a cooling body in the welding device 1 has something in it or is dirty. Further possible fault conditions or causes of faults are e.g. excessively high ambient temperature $T_U$ in the vicinity of the welding device 1 or that individual cooling units are defective or impaired. In this way it is possible for the maintenance personnel to carry out maintenance of the cooling arrangement of the welding device 1 in a preventative manner before critical limit temperatures are reached at the component 2-i concerned within the welding device 1. In the case of excessively high ambient temperature, the maintenance personnel can ensure sufficient cooling of the ambient air of the welding current source. This means that undesired failure of the welding device 1 within the installation can be avoided in a preventative manner so that the productivity of the installation is increased. Furthermore, the service life of the different components 2-i within the welding device 1 is increased by the avoidance of excessively high temperatures. Upon identification of a potential fault in the cooling arrangement of the welding device 1, the monitoring unit 5 can additionally actuate actuators within the welding device 1 in a targeted manner in order to avoid the fault which has occurred. For example, if the monitoring unit 5 identifies, with the aid of the temperature progressions signalled to it, that the local cooling unit of the component 2-1 within the cooling path 8 is faulty or has failed completely, it can actuate the ventilator 6 for transitional elimination or alleviation of the fault in such a way that the cooling of the affected component 2-1 is increased. Thus, e.g. the rotational speed of the ventilator 6 can be increased to the maximum value. After elimination of the cause of the fault which has lead to the increased temperature progression, the monitoring unit 5 can then operate the ventilator 6 normally.

With the aid of the result of the analysis, a signal to the user/operator can also take place so that this person carries out a targeted check of the component 2-1 concerned. In a corresponding manner, measures can also be proposed for elimination of the fault, such as e.g. tightening screw connections to heat sinks or removing local dirt. However, dirt can also be removed e.g. by a change in the air direction of the ventilator 6. However, with the aid of an actuator, compressed air or a protective gas necessary to the welding process can also be blown through a filter so that this is cleaned and more supply air can be drawn in.

The temperature sensors 3-1, 3-2 can also be disposed in such a way that they detect a temperature at the inlet and at the outlet of the cooling air path 8 of the cooling air L. For this purpose, additional temperature sensors can also be used. A thermal balance can also be determined by the monitoring unit 5 and conclusions can be drawn about possible faults. For this purpose, a data model, reference values, etc. can be used—as already described.

Figure 2:
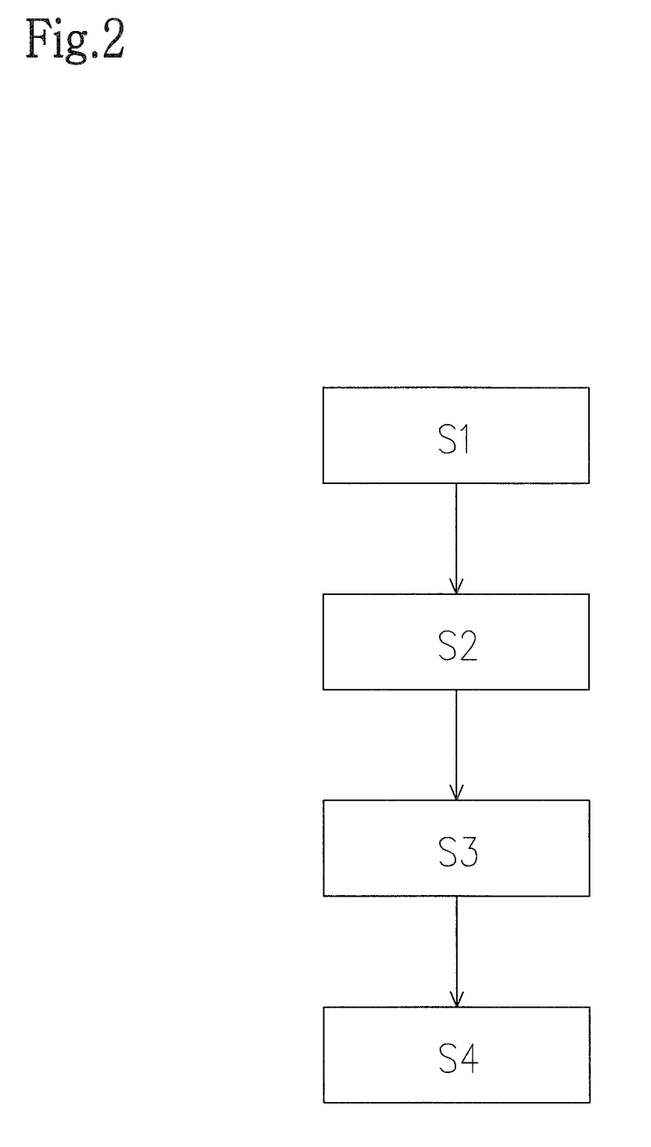
FIG. 2 shows a flow diagram for illustrating an exemplified embodiment of the method in accordance with the invention for monitoring an operating state of a device cooling arrangement in the case of a device.

FIG. 2 shows a flow diagram for illustrating an exemplified embodiment of the method in accordance with the invention for monitoring an operating state of a device cooling arrangement in the case of a device, e.g. the welding device 1 illustrated in FIG. 1.

In a first step S1, an operating temperature progression T(t) of at least one component 2-i of the device 1 is detected. In a further step S2, the operating state of the device cooling arrangement is determined on the basis of the at least one detected operating temperature progression and power provided by the device 1.

In the case of a deviation in the determined operating state of the device cooling arrangement from a normal operating state of the device cooling arrangement, in a possible embodiment of the method in accordance with the invention the detected operating temperature progressions T(t) of the components are analysed to identify at least one potential cause of the deviation in the operating state of the device cooling arrangement in step S3.

In a further possible embodiment, the deviation in the operating state of the device cooling arrangement and at least one identified potential cause of the deviation in the operating state is output via a user interface or a network interface of the device 1 in step S4. Preferably, additional instructions for elimination of the corresponding cause are output via the user interface and/or the network interface to a user or a central control device in step S4.

After the maintenance measure has been carried out, the monitoring unit 5 can carry out a check as to whether the corresponding maintenance measure has led to elimination of the deviation in the operating state of the device cooling arrangement and therefore the maintenance measure has been successful.

The method illustrated in FIG. 2 is preferably carried out by a monitoring program which runs on a microprocessor of the monitoring unit 5. In a possible embodiment, this monitoring program can be loaded into a program memory of the monitoring unit 5 via the network interface 12 of the device 1. In a possible embodiment, the corresponding monitoring program is loaded via a network from a server which is operated e.g. by the manufacturer of the device 1. Apart from the program memory for the monitoring program, the monitoring unit 5 in a further possible embodiment has a further data memory to store the data model of the components or assemblies contained in the device 1. In a possible embodiment, this data model of the device 1 can likewise be downloaded via the network interface 12 from a database or a server. The loaded data model can consider different configurations or variations of the device 1. The loading of the monitoring program and/or of the data model takes place in a possible embodiment in response to an input by a user via the user interface 11 of the device 1. In the exemplified embodiment illustrated in FIG. 1, the monitoring unit 5 is integrated in the device 1. In an alternative embodiment, the monitoring unit 5 can also be integrated in a central control device of an installation, which is connected via a network to one or a plurality of devices 1. In a possible embodiment, the central control device of the installation can dynamically adapt different maintenance plans for different devices, in particular welding devices 1, corresponding to the signalled temperature progressions and deviations in the operating state of the device cooling arrangements. In a possible embodiment, the device 1 illustrated in FIG. 1 is integrated in an installation, e.g. a manufacturing installation. In an alternative embodiment, the device 1 can also be a portable mobile device for mobile use. The device 2 is an energy device which provides electric power in the form of direct current or alternating current. In a possible embodiment, the device 1 is a welding device, as schematically illustrated in FIG. 1. In alternative embodiments the device 1 is a battery charging device or an inverter of a photovoltaic installation for conversion of direct current to alternating current.

The invention claimed is:

1. Device (1) for provision of electric power, wherein the device (1) comprises: integrated temperature sensors (3-1, 3-2) which detect operating temperature progressions of components (2-1, 2-2) of the device (1) and a monitoring unit (5) which, on the basis of the detected operating temperature progressions and the power, monitors the operating state of a device cooling arrangement of the device (1), wherein the device cooling arrangement of the device (1) comprises, as a component, at least one ventilation unit (6) which supplies cooling air from the vicinity of the device (1) to further components (2-1, 2-2) of the device (1) along a cooling air path (8) within a housing of the device (1), wherein the monitoring unit (5) has access to an internal or external data memory wherein the monitoring unit (5) is designed to analyse, in the case of a deviation of the monitored operating state of the device cooling arrangement from a normal operating state of the device cooling arrangement, the detected operating temperature progressions of different components (2-1, 2-2) in order to determine at least one potential cause of the deviation in the operating state, and wherein the components (2-1, 2-2) of the device (1) are electronic and/or electromechanical components and associated cooling units for cooling the respective component (2-1, 2-2) are provided, characterised in that the internal or external data memory stores a data model of the components (2-1, 2-2, 6) contained in the device (1) and the physical position thereof along the cooling air path (8), wherein the monitoring unit (5) takes into consideration the data model stored in the data memory to distinguish a fault in at least one component of the components (2-1, 2-2) of the device (1) from a blocking of the cooling air supply within the cooling path (8) within the device (1).

2. Device (1) as claimed in claim 1, wherein at least one further temperature sensor (9) detects an ambient temperature in the vicinity of the device (1) and signals it to the monitoring unit (5) of the device (1).

3. Device (1) as claimed in claim 1,
wherein the device (1) comprises a user interface (11) which comprises a display unit for displaying the deviation in the operating state of the device cooling arrangement, the determined cause of the deviation in the operating state and instructions for eliminating the determined cause of the deviation in the operating state of the device cooling arrangement.

4. Device (1) as claimed in claim 3,
wherein a current (I) is supplied by a welding current source to the device (1), and
wherein the user interface (11) comprises an input unit for adjustment of the current (I) by a user and/or by a central control device of an installation.

5. Device (1) as claimed in claim 1,
wherein components (2-1, 2-2) along the cooling air path (8) comprise associated temperature sensors (3-1, 3-2) which detect an operating temperature progression at the respective components (2-1, 2-2) and signal it to the monitoring unit (5) of the device (1).

6. Device (1) as claimed in claim 4,
wherein a current measuring unit (10) of the device (1) measures the adjusted current (I) and signals it to the monitoring unit (5).

7. Device (1) as claimed in claim 1, wherein the monitoring unit (5) controls a cooling unit and/or the ventilation unit (6), in dependence upon the momentary operating state of the device cooling arrangement.

8. Device (1) as claimed in claim 1, wherein the monitoring unit (5) signals the operating state of the device cooling arrangement to a central control device of an installation via a network interface (12) of the device (1).

9. Method for monitoring an operating state of a device cooling arrangement in a device (1), comprising the steps of:
(a) detecting (S1) an operating temperature progression of components (2) of the device (1);

(b) determining (S2) the operating state of the device cooling arrangement on the basis of the detected operating temperature progressions and electric power provided by the device (1);

(c) analysing (S3) the detected operating temperature progressions of the components (2) in the case of a deviation of the determined operating state of the device cooling arrangement from a normal operating state of the device cooling arrangement in order to identify at least one potential cause of the deviation in the operating state of the device cooling arrangement, wherein a stored data model of the components (2) contained in the device (1) and the physical position thereof along a cooling air path (8) are taken into consideration to distinguish a fault in at least one component of the components (2-1, 2-2) of the device (1) from a blocking of the cooling air supply within the cooling path (8) within the device (1).

10. Method as claimed in claim 9, wherein a deviation in the operating state of the device cooling arrangement and at least one identified potential cause of the deviation in the operating state and instructions for eliminating the corresponding cause are output (S4) via a user interface (11) and/or a network interface (12) of the device (1).

* * * * *